US010825543B2

United States Patent
Shalom et al.

(10) Patent No.: US 10,825,543 B2
(45) Date of Patent: Nov. 3, 2020

(54) LOCATING FAILURES IN MEMORY WITH REDUNDANCY

(71) Applicant: INTERNATIONAL BUSINESS MACHINES CORPORATION, Armonk, NY (US)

(72) Inventors: Hezi Shalom, Tel Aviv (IL); Noam Jungmann, Tel Aviv (IL); Israel A. Wagner, Zichron-Yaakov (IL); Yaron Freiman, Tel Aviv (IL); Amit A. Atias, Tel Aviv (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/044,542

(22) Filed: Jul. 25, 2018

(65) Prior Publication Data
US 2020/0035322 A1 Jan. 30, 2020

(51) Int. Cl.
*G11C 29/44* (2006.01)
*G11C 29/52* (2006.01)
*G11C 29/00* (2006.01)
*G06F 12/02* (2006.01)
*G06F 17/50* (2006.01)
*G06F 30/30* (2020.01)

(52) U.S. Cl.
CPC .......... *G11C 29/44* (2013.01); *G06F 12/0246* (2013.01); *G06F 30/30* (2020.01); *G11C 29/52* (2013.01); *G11C 29/76* (2013.01)

(58) Field of Classification Search
CPC ......... G11C 29/44; G11C 29/52; G11C 29/76; G06F 12/0246; G06F 17/5045
See application file for complete search history.

(56) References Cited

U.S. PATENT DOCUMENTS

| 5,153,880 A * | 10/1992 | Owen | ................. G11C 29/789 365/200 |
| 5,161,157 A * | 11/1992 | Owen | ................. G06F 11/006 714/6.32 |
| 5,657,281 A * | 8/1997 | Rao | ..................... G11C 29/808 365/200 |
| 6,321,294 B1 | 11/2001 | Perry | |
| 7,237,154 B1 * | 6/2007 | Zorian | ............. G11C 29/56008 714/711 |
| 7,339,843 B2 | 3/2008 | Min et al. | |

(Continued)

OTHER PUBLICATIONS

Rab, Muhammad T. et al. "Improving Memory Repair by Selective Row Partitioning" Abstract, Defect and Fault Tolerance in VLSI Systems, 2009, DFT '09; 24th IEEE International Symposium; http://ieeexploreieee.org/document/5372254/ ; 3 pgs.

*Primary Examiner* — Kyle Vallecillo
(74) *Attorney, Agent, or Firm* — Cantor Colburn LLP; Margaret McNamara

(57) ABSTRACT

An example computer-implemented method includes receiving hardware testing results, an address, input/output (I/O) data, a redundancy status, and an input-memory-output mapping corresponding to a memory being tested. The method includes locating a failed cell of the memory based on the hardware testing results, the address, the input/output data, the redundancy status, and the input-memory-output mapping. The method also includes automatically repairing the failed cell.

17 Claims, 6 Drawing Sheets

(56) References Cited

U.S. PATENT DOCUMENTS

| | | | |
|---|---|---|---|
| 7,768,840 B1* | 8/2010 | Aleksanyan | G11C 7/18 365/189.02 |
| 8,930,779 B2 | 1/2015 | Ware et al. | |
| 9,449,720 B1 | 9/2016 | Lung | |
| 2002/0136066 A1* | 9/2002 | Huang | G11C 29/24 365/200 |
| 2004/0208070 A1* | 10/2004 | Nagata | G11C 29/44 365/201 |
| 2005/0270866 A1* | 12/2005 | Ouellette | G11C 29/14 365/200 |
| 2006/0064618 A1* | 3/2006 | Wu | G11C 29/72 714/733 |
| 2007/0168794 A1* | 7/2007 | Roohparvar | G11C 29/025 714/724 |
| 2008/0022149 A1* | 1/2008 | Ouellette | G11C 29/14 714/6.12 |
| 2010/0064186 A1* | 3/2010 | Houg | G11C 29/76 714/711 |
| 2011/0090751 A1* | 4/2011 | Manna | G11C 29/4401 365/200 |
| 2013/0173970 A1* | 7/2013 | Kleveland | G11C 29/44 714/710 |
| 2015/0199230 A1 | 7/2015 | Park et al. | |
| 2015/0270015 A1 | 9/2015 | Murphy et al. | |
| 2017/0017546 A1 | 1/2017 | Qidwai et al. | |
| 2017/0184662 A1* | 6/2017 | Varadarajan | G11C 29/44 |
| 2018/0358108 A1* | 12/2018 | Kim | G11C 29/44 |

\* cited by examiner

LOCATING FAILURES IN MEMORY WITH REDUNDANCY

BACKGROUND

The present techniques relate to memory repair. More specifically, the techniques relate to locating failures in memory with redundancy.

SUMMARY

According to an embodiment described herein, a system can include processor to receive hardware testing results, an address, input/output (I/O) data, a redundancy status, and an input-memory-output mapping corresponding to a memory being tested. The processor can also locate a failed cell of the memory based on the hardware testing results, the address, the input/output data, the redundancy status, and the input-memory-output mapping. The processor can also further automatically repair the failed cell.

According to another embodiment described herein, a method can include receiving hardware testing results, an address, input/output (I/O) data, a redundancy status, and an input-memory-output mapping corresponding to a memory being tested. The method can further include locating a failed cell of the memory based on the hardware testing results, the address, the input/output data, the redundancy status, and the input-memory-output mapping. The method can also further include automatically repairing the failed cell.

According to another embodiment described herein, a computer program product for locating failed cells in memory can include computer-readable storage medium having program code embodied therewith. The computer readable storage medium is not a transitory signal per se. The program code executable by a processor to cause the processor to receive hardware testing results, an address, input/output (I/O) data, a redundancy status, and an input-memory-output mapping corresponding to a memory being tested. The program code can also cause the processor to locate a failed cell of the memory based on the hardware testing results, the address, the input/output data, the redundancy status, and the input-memory-output mapping. The program code can also cause the processor to automatically repair the failed cell.

DETAILED DESCRIPTION

Large memory instances have increasing cell counts. As used herein, a memory instance refers to a smallest logical unit of a memory that is accessible by a tester. For example, the memory may be a static random-access memory (SRAM), or any other type of memory such as dynamic random-access memory (DRAM), magnetoresistive random-access memory (MRAM), resistive random-access memory (RRAM), etc. As used herein, an instance refers to an array of memory cells. A memory may be logically divided in a number of memory instances. For example, a memory device of 10 gigabytes may be divided into ten one gigabyte instances. A memory instance may be further subdivided into smaller units referred to herein as subgroups. For example, each one gigabyte instance may be subdivided into a predetermined number of subgroups. In some examples, this may depend on a redundancy type used, among other factors. Memory cell locations in a full memory instance and within a subgroup can impact both performance and yield. In hardware testing, the location of failures may provide more information about potential failures and yield detraction root cause and how to deal with memory failures. However, hardware test teams testing multiple design points may not be familiar with a specific design microarchitecture being tested. Moreover, the mapping of logical addresses to physical locations in a memory cell may not be intuitive. For example, the mapping and splitting of memory instances into subgroups may be different for each memory instance. Furthermore, large memory instances may have redundancy mechanisms that provide repair solutions for a few damaged cells by shifting rows or columns. The redundancy mechanism may thus further add complexity to the mapping of logical addresses to physical locations. For example, two failures may appear to be next to each other logically, but physically may be located in different places.

According to techniques described herein, hardware testing results, an address, input/output (I/O) data, a redundancy status, and an input-memory-output mapping corresponding to a memory being tested may be received. A failed cell of the memory may be located based on the hardware testing results, the address, the input/output data, the redundancy status, and the input-memory-output mapping. The failed cell may be automatically repaired. Thus, the techniques described herein enable mapping of memory cells by given address and I/O. The techniques described herein may also provide a logic hierarchy full path, layout location (x,y) and visualization of the cell location inside the memory instance. Moreover, the techniques enable fail address translation and automatic invocation of redundancy translation.

Figure 1:
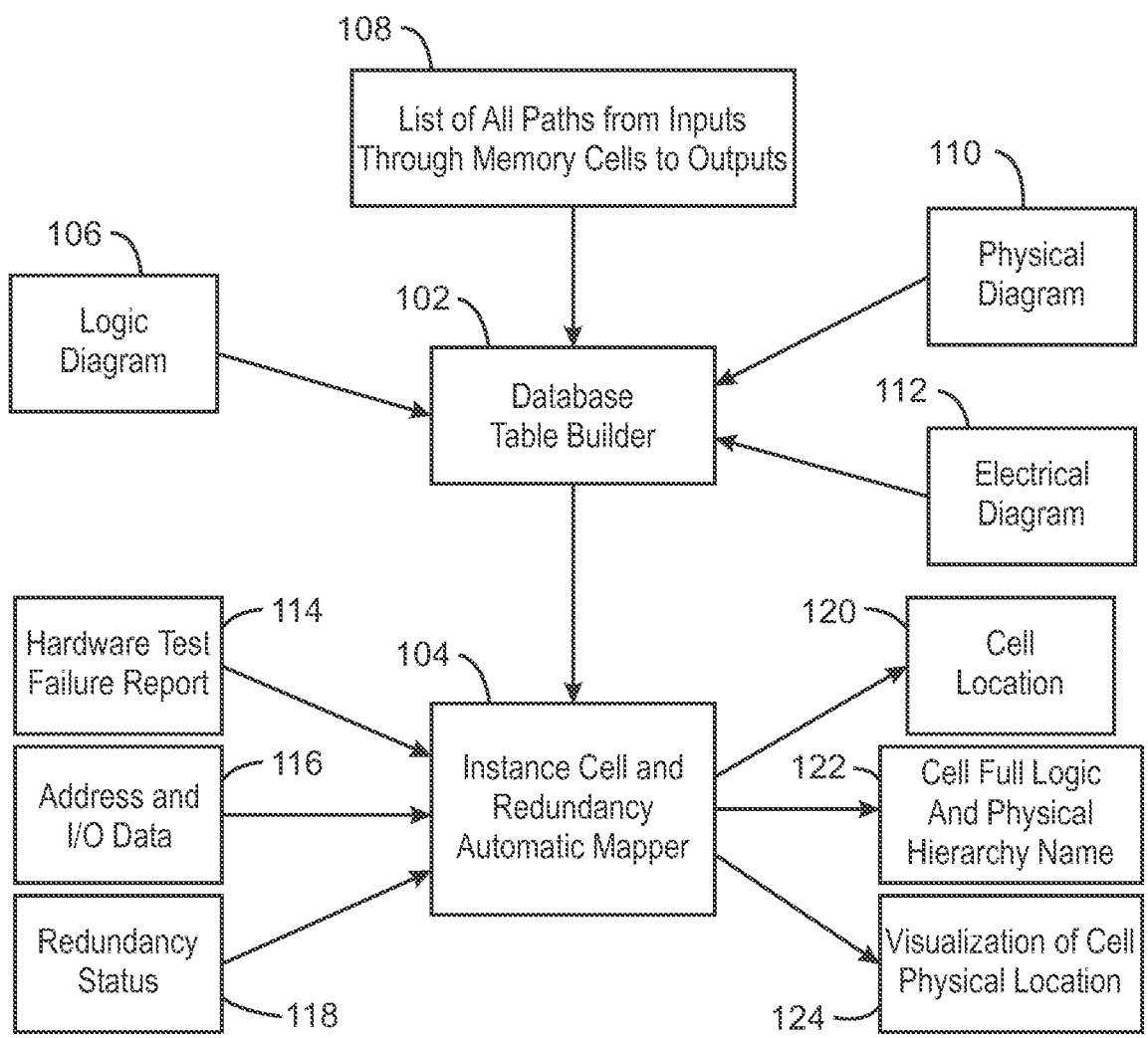
FIG. 1 is a block diagram of an example system for locating failures in memory having redundancy.

With reference now to FIG. 1, a block diagram shows an example system 100 for locating failures in memory having redundancy. The example system 100 of FIG. 1 includes a database table builder 102 to build database tables for use in mapping memory cells. The database table builder 102 is communicatively coupled to an instance cell and redundancy automatic mapper 104. The database table builder 102 is shown receiving a logic diagram 106, a list of all paths 108 from inputs through memory cells to outputs, a physical diagram 110, and an electrical diagram 112. For example, the logic diagram 106 may be any logical representation of one or more memory instances corresponding to a memory being tested. In some examples, the logic diagram 106 may be received in the form of a Very High Speed Integrated Circuit (VHSIC) Hardware Description Language (VHDL) that describes the logical design of one or more memory instances of a memory chip. The list of paths 108, which includes all paths from input to memory and from memory to output, may be received from a circuit analysis tool. A path may include a list of all internal nodes between a source and a sink of the path. For example, the tool may be a timing tool, a testability tool, or any other tool that produces paths between inputs to memory cells to outputs. The physical diagram 110 may be an integrated circuit layout that includes geometric representations of shapes which, when manufactured in the corresponding layers of materials, become the functioning components of a memory chip. For example, individual cells of a memory instance may be seen in the physical diagram 110. The electrical diagram 112 may be a schematic diagram that represents elements of a memory chip using electrical symbols. For example, the electrical diagram 112 may be organized such that the connections between the symbols for the electrical components are easily discernible.

Figure 2:
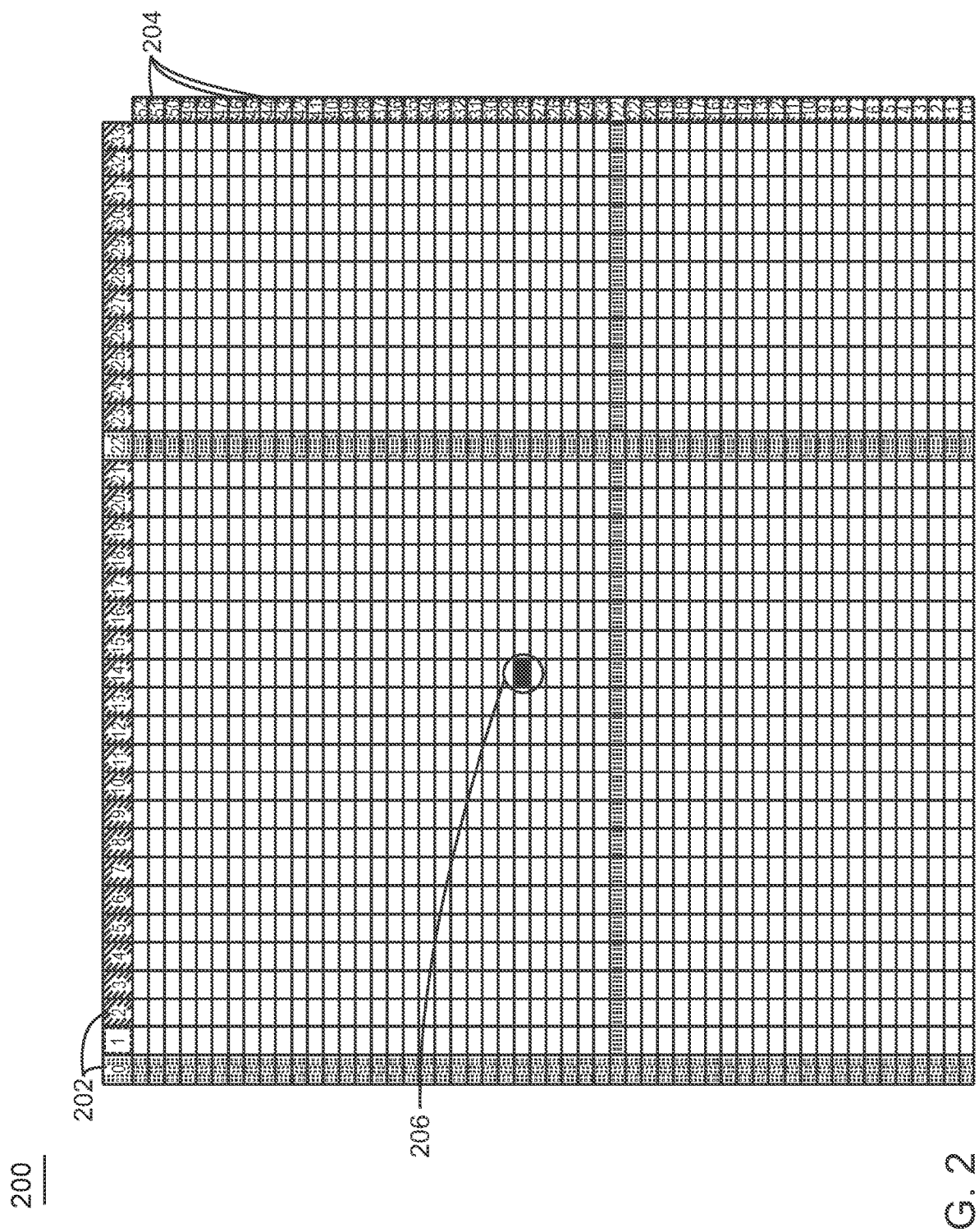
FIG. 2 is an example visualization of a physical failure location of a failed cell in a memory utilizing redundancy.

Still referring to FIG. 1, the instance cell and redundancy automatic mapper 104 is shown receiving a hardware test failure report 114, address and input/output (I/O) data 116, and a redundancy status 118. For example, the hardware test failure report 114 may be received from a tester (not shown). The tester may be any suitable testing tool used for performing hardware tests on memory. For example, the testing tool may be a logic analyzer such as the TLA7000 Logic Analyzer by Tektronix® or the UltraFlex™ test system by Teradyne®. In some examples, the address and I/O data 116 may also be received from the tester. For example, the address may be the address of a memory word. A word may be a group of a predefined number of bits that are being written simultaneously. The I/O data 116 may include particular bits sought to be written to or read from the address. The bits may be written or read in chunks such as words. In some examples, the I/O data 116 may be one or more bits written, read, or both. The redundancy status 118 may include whether or not a redundancy is used as well as what type of redundancy is being used. For example, a memory instance may use redundancy across rows of cells, columns of cells, or both rows and columns of cells within the memory instance. The instance cell and redundancy automatic mapper 104 is shown outputting a cell location 120, a cell full logic and physical hierarchy name 122, and a visualization of cell physical location 124. For example, the cell location 120 may be an (x,y) coordinate of a cell in a layout. An example, cell location 120 is shown in FIG. 2 below. The cell full logic and physical hierarchy name 122 may be a string such as a string in the form: "MACRO.CORE_LEFT.SUBARRAY.GEN_WR_MASK2. V.ARRAY_CONTENT%% %12%%%(114).latch_master".

Every cell in a memory instance may have a logical name. Sometimes a logic name may not be the same as the physical name. The cell full logic and physical hierarchy name 122 may be a mapping between the two, with both names output together. The visualization of the cell physical location 124 may be a two dimensional layout of cells in rows and columns. An example cell physical location 124 is described with respect to FIG. 2 below.

In the example system 100 of FIG. 1, an SRAM chip corresponding to the logic diagram 106, list of paths 108, physical diagram 110, and electrical diagram 112 may be tested using a tester. For example, the SRAM chip may employ one or more types of redundancy, making it difficult to determine a precise location of any hardware failure as mentioned above. The database table builder 102 may generate a database table to be used by the instance cell and redundancy automatic mapper 104. The database table builder 102 may generate the database table based on the logic diagram 106, the list of paths 108, the physical diagram 110, and the electrical diagram 112. For example, the database table builder 102 may build the database table in two phases. The first phase may include determining input-memory-output paths based on the logic diagram 106, list of paths 108, physical diagram 110, and electrical diagram 112. For example, the input-memory-output paths may be determined using the algorithm:

```
For each $DATA_INPUT in (VHDL "in" list) do
    For each $CTRL_INPUT in (VHDL "in" list) do
        Find path from ($CTRL_INPUT,$DATA_INPUT) to an
            $SRAM cell (using path list )
        Find (x,y) location of $SRAM (using schematic and layout)
        output to map: {$DATA_INPUT,$CTRL_INPUT,
            $SRAM,(x,y)}
        For each $DATA_OUTPUT in (VHDL "out" list) do
            Find path from cell ($SRAM,$CTRL_INPUT) to
                $DATA_OUTPUT (if one exists) using path list
            output to map {$SRAM, (x,y), $DATA_OUTPUT}
        End(for)
    End(for)
End(for)
``` where $DATA_INPUT is data to be stored in the memory and $CTRL_INPUT is everything that is not data, such as an address, and clock information, as well as redundancy information. For example, the redundancy information may include how redundancy is used, whether redundancy is used, etc. Thus, for each data input detected in the logic diagram 106, the database table builder 102 may detect associated control inputs and determine a path from the control input to an SRAM cell using the list of paths 108. The database table builder 102 may also determine a coordinate location for the SRAM cell using the physical diagram 110 and the electrical diagram 112. The output result for mapping may be a data input, associated control input, an SRAM cell, and coordinate location for the SRAM cell. For each associated control input, the database table builder 102 may also find an associated data output using the logic diagram 106 and determine a path from the SRAM cell to the data output, if one exists. The output result for mapping may be an SRAM cell with the coordinate location of the SRAM cell and associated data output.

The database table builder 102 may then arrange the database table based on the detected input-memory-output paths. For example, for each input, the database table builder 102 may add a visual pointer from the input to the coordinate location of each SRAM cell within the cone of the input as determined using the map. As used herein, a cone refers to a subset of cells in a memory instance affected by a particular input. For example, the table may be arranged using the algorithm:

```
For each $INPUT in map
    For each $SRAM in cone($INPUT) [according to the map]
        Add a visual pointer from $INPUT to $SRAM(x,y)
    End(for)
End(for)
```

The resulting database table may be used by the instance cell and redundancy automatic mapper 104 to map detected failures to particular SRAM cells. For example, the instance cell and redundancy automatic mapper 104 may receive a hardware test failure report 114, address and I/O data 116, and redundancy status 118 of the SRAM memory and output a cell location 120 corresponding to the failure, a cell full logic and physical hierarchy name 122, and a visualization of the cell's physical location 124. For example, the output visualization 124 may be the visualization of FIG. 2 below. In some examples, the cell location 120, cell full logic and physical hierarchy name 122, visualization of the cell's physical location 124, or any combination thereof, may be used to automatically repair the failure. For example, in response to detecting a defect in a certain row or column, the defective row or column may be replaced by a redundant one by applying REPAIR-CONTROL inputs.

It is to be understood that the block diagram of FIG. 1 is not intended to indicate that the system 100 is to include all of the components shown in FIG. 1. Rather, the system 100 can include fewer or additional components not illustrated in FIG. 1 (e.g., additional diagrams, hardware test failure reports, addresses, I/O data, cells, cell locations, etc.).

FIG. 2 is an example visualization of a physical failure location of a failed cell in a memory utilizing redundancy. The example visualization 200 can be generated using the system 100 of FIG. 1 above, the computing device 500 of FIG. 5, or the computer-readable media 600 of FIG. 6 below.

The example visualization 200 of FIG. 2 includes a set of columns 202 numbered from 0 to 33, and a set of rows 204 numbered from 0 to 52, forming a set of cells. The visualization 200 further includes a failed cell 206 indicated by a darker cell. In some examples, a user wanting to see the physical location of a cell may use the visualization 200 to see exactly where the failed cell causing a failure in a test is located. In the case of FIG. 2, the failed cell is located at column 14 and row 28. Columns 0 and 22 are highlighted as well as row 22 to show rows and columns that include one or more faulty cells and are skipped due to a repair operation.

It is to be understood that the drawing of FIG. 2 is not intended to indicate that the visualization 200 is to include all of the components shown in FIG. 2. Rather, the visualization 200 can include fewer or additional components not illustrated in FIG. 2 (e.g., additional rows, columns, cells, failed cells, etc.).

Figure 3:
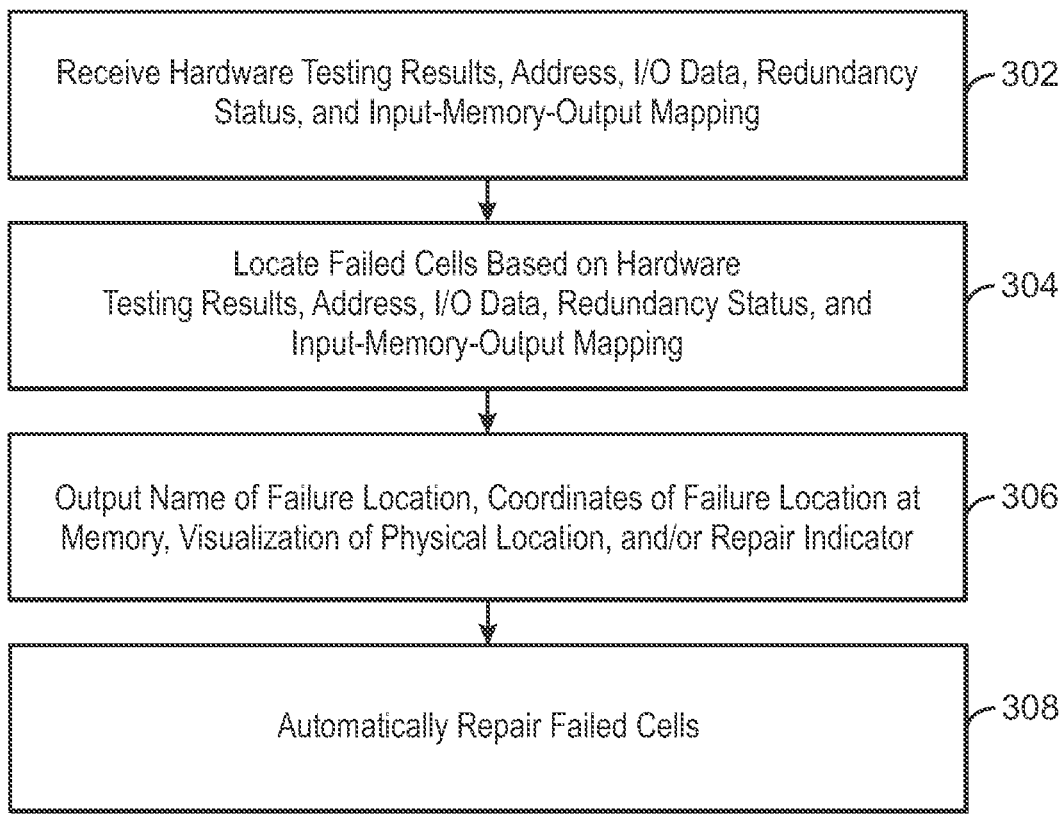
FIG. 3 is a block diagram of an example method that can locate failures in memory using redundancy.

FIG. 3 is a process flow diagram of an example method that can locate failures in memory using redundancy. The method 300 can be implemented with any suitable computing device, such as the computing device 500 of FIG. 5 or the system 100 of FIG. 1. For example, the methods described below can be implemented by the processor 502 of FIG. 5.

At block 302, a processor receives hardware testing results, an address, input/output (I/O) data, a redundancy status, and an input-memory-output mapping corresponding to a memory being tested. For example, the hardware testing results, the address, the I/O data, and redundancy status may be received from a testing tool. The testing tool, also referred to herein as a tester, may be a timing tool or a testability tool, among other tools. The hardware testing results may include an address and I/O data. The address may be the address corresponding to a memory location associated with the I/O data that led to a failure. As one example, a hardware failure output line may be: "RESULTSINST.EPN.L3F.L3CABF0. FAR.ABIST_AT_SPEED_RA14.RPR_DL_RAI1 0101 00000001110 0 1011011 1 1 0 1 111" wherein "0101" is the Algorithmic Test Sequence (ATS) number, "00000001110" is the address "1011011" the I/O data, and the first three binary numbers "1 1 0" of the last five represent values for three available failure options including single cell fail (SCF), multi-fault wordline (MFW), and multi-fault-column (MFC). The ATS number may refer to a particular instance that is failing within a failure lien that may include a group of instances. SCF refers to a failure where only one cell is failing on a specific wordline (row) and column. MFW refers to a failure where more than one cell on the same wordline is failing. For example, an MFW may be resolved using a wordline fix. MFC refers to a failure where more than one cell on the same column is failing. For example, an MFC may be resolved using a column fix.

In some examples, the hardware failure results may include an address accessed, expected data, and actual data received. For example, the actual data received may be different from the expected data. A mismatch can be detected on one or more of the bits. For example, the tester may receive 4 bits at a time, but may detect which I/O bits are failing the compare. Thus, the tester can identify an address attempted to be accessed, and the failing position of the output set of bits, which may be provided as input to the processor. In some examples, the redundancy status may include whether or not redundancy is used by a memory device as well as the type of redundancy used. For example, the redundancy used by a memory device may include row redundancy, column redundancy, or both row and column redundancy.

At block 304, the processor locates a failed cell of the memory based on the hardware testing results, the address, the input/output data, the redundancy status, and the input-memory-output mapping. For example, faulty cells in a memory instance may be located using SCF, MFW, or MFC indicators.

At block 306, the processor outputs the name of a location of a failed cell, coordinates of the location of the failed cell of memory, the visualization of a physical location of the failed cell, and/or a repair indicator. For example, the name of the location of the failed cell may be a cell full logic and physical hierarchy name. An example cell full logic and physical hierarchy name may be "mac_macro.CORERAM_LEFT . . . cell0(1).tru", which may be the full logical path to an internal node ("tru") of a specific cell. The coordinates of the location of the failed cell may be the (x,y) coordinates of the failed cell in a physical layout diagram. The visualization of the physical location may be a two dimensional diagram showing one or more cells including the failed cell. In some examples, the visualization may also include the subarray, the wordline and the bitline related to the faulty cell. The repair indicator may indicate whether a repair is to be performed or whether a repair has been automatically performed. In some examples, a repair may be performed manually or automatically, as described below.

At block 308, the processor automatically repairs the failed cell. For example, the processor may automatically repair the failed cell by replacing the wordline or the bitline of the faulty cell with other, redundant, wordline or bitline. For example, if the cell at WL=22, BL=15 fails, the processor may replace wordline 22 with a redundant wordline, say WL=129, and configure the address decoder logic to defer any access to wordline 22 into an access to wordline 129.

The process flow diagram of FIG. 3 is not intended to indicate that the operations of the method 300 are to be executed in any particular order, or that all of the operations of the method 300 are to be included in every case. Additionally, the method 300 can include any suitable number of additional operations.

Figure 4:
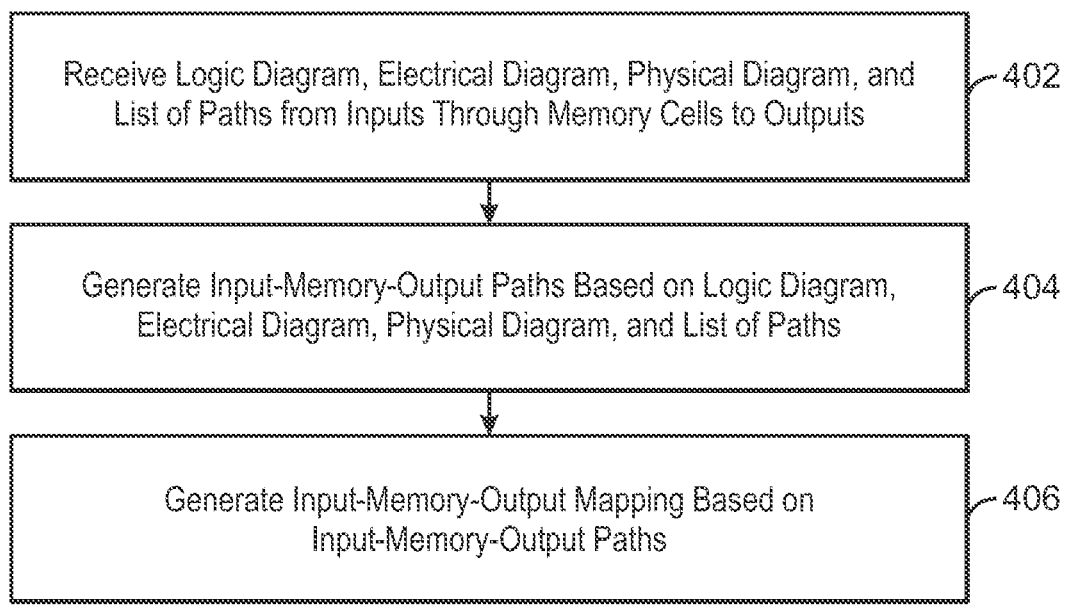
FIG. 4 is a block diagram of an example method that can generate an input-memory-output mapping table.

FIG. 4 is a process flow diagram of an example method that can generate an input-memory-output mapping table. The method 400 can be implemented with any suitable computing device, such as the computing device 500 of FIG. 5 and is described with reference to the systems 100 FIG. 1. For example, the methods described below can be implemented by the processor 502 of FIG. 5.

At block 402, a processor receives a logic diagram, an electrical diagram, and a physical diagram, and a list of paths from input through memory cells to outputs. For example, the logic diagram may be a VHDL diagram corresponding to the memory being tested. The electrical diagram may be an electrical schematic of the memory being tested. The physical diagram may be a layout of the memory being tested. The list of paths may be a list of connections within a memory device resulting from a testing tool analysis. For example, the testing tool may be a timing tool, a testability tool, or any other tool that analyzes paths within a memory.

At block 404, the processor generates input-memory-output paths based on the logic diagram, physical diagram, and the list of paths. For example, for each data input detected in the logic diagram, the processor may detect associated control inputs and determine a path from the control input to an memory cell using the list of paths. The processor may also determine a coordinate location for the memory cell using the physical diagram and the electrical diagram. The output result of the data input analysis may be a data input, associated control input, a memory cell, and coordinate location for the memory cell. For each associated control input, the processor may also find an associated data output using the logic diagram and determine a path from the memory cell to the data output, if one exists. The output result of the data output analysis may be a memory cell with the coordinate location of the memory cell and associated data output. The outputs may be joined to generate input-memory-output paths. For example, the processor may generate the paths using the techniques described in greater detail above.

At block 406, the processor generates the input-memory-output mapping based on the input-memory-output paths. For example, for each input, the database table builder 102 may add a visual pointer from the input to the coordinate location of each SRAM cell within the cone of the input as determined using the map. The mapping may thus be used to build a database table arranged by adding a visual pointer from the input to the coordinate location of each memory cell within a cone of each input. For example, the database table may be arranged using the algorithm described with respect to FIG. 1 above.

The process flow diagram of FIG. 4 is not intended to indicate that the operations of the method 400 are to be executed in any particular order, or that all of the operations of the method 400 are to be included in every case. Additionally, the method 400 can include any suitable number of additional operations.

Figure 5:
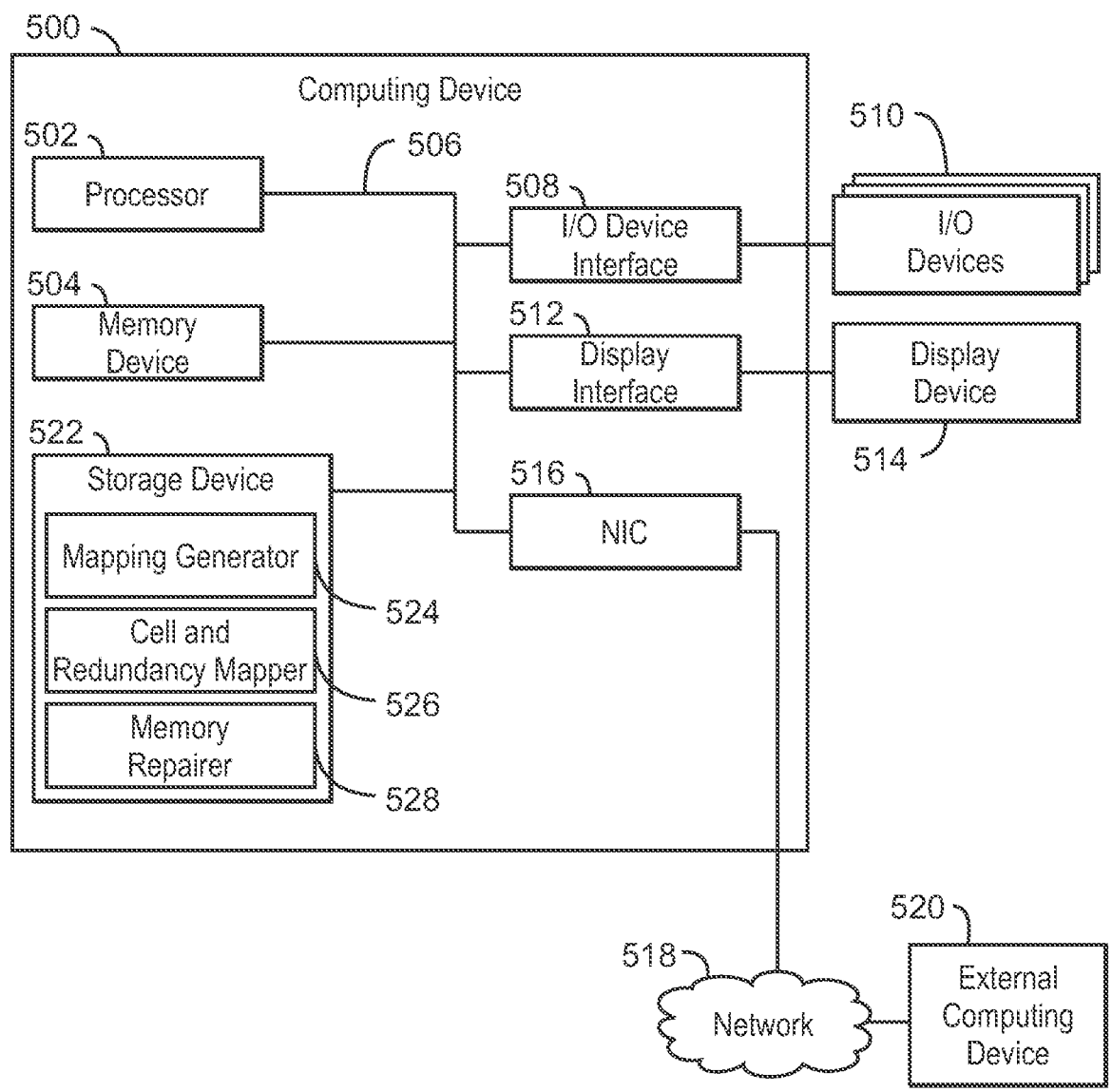
FIG. 5 is a block diagram of an example computing device that can automatically locate and repair failures in memory using redundancy.

FIG. 5 is block diagram of an example computing device that can automatically locate and repair failures in memory using redundancy. The computing device 500 may be for example, a server, desktop computer, laptop computer, tablet computer, or smartphone. In some examples, computing device 500 may be a cloud computing node. Computing device 500 may be described in the general context of computer system executable instructions, such as program modules, being executed by a computer system. Generally, program modules may include routines, programs, objects, components, logic, data structures, and so on that perform particular tasks or implement particular abstract data types. Computing device 500 may be practiced in distributed cloud computing environments where tasks are performed by remote processing devices that are linked through a communications network. In a distributed cloud computing environment, program modules may be located in both local and remote computer system storage media including memory storage devices.

The computing device 500 may include a processor 502 that is to execute stored instructions, a memory device 504 to provide temporary memory space for operations of said instructions during operation. The processor can be a single-core processor, multi-core processor, computing cluster, or any number of other configurations. The memory 504 can include random access memory (RAM), read only memory, flash memory, or any other suitable memory systems.

The processor 502 may be connected through a system interconnect 506 (e.g., PCI®, PCI-Express®, etc.) to an input/output (I/O) device interface 508 adapted to connect the computing device 500 to one or more I/O devices 510. The I/O devices 510 may include, for example, a keyboard and a pointing device, wherein the pointing device may include a touchpad or a touchscreen, among others. The I/O devices 510 may be built-in components of the computing device 500, or may be devices that are externally connected to the computing device 500.

The processor 502 may also be linked through the system interconnect 506 to a display interface 512 adapted to connect the computing device 500 to a display device 514. The display device 514 may include a display screen that is a built-in component of the computing device 500. The display device 514 may also include a computer monitor, television, or projector, among others, that is externally connected to the computing device 500. In addition, a network interface controller (NIC) 516 may be adapted to connect the computing device 500 through the system interconnect 506 to the network 518. In some embodiments, the NIC 516 can transmit data using any suitable interface or protocol, such as the internet small computer system interface, among others. The network 518 may be a cellular network, a radio network, a wide area network (WAN), a local area network (LAN), or the Internet, among others. An external computing device 520 may connect to the computing device 500 through the network 518. In some examples, external computing device 520 may be an external web-server 520. In some examples, external computing device 520 may be a cloud computing node.

The processor 502 may also be linked through the system interconnect 506 to a storage device 522 that can include a hard drive, an optical drive, a USB flash drive, an array of drives, or any combinations thereof. In some examples, the storage device may include a mapping generator 524, a cell and redundancy mapper 526, and a memory repairer 528. The mapping generator 524 can receive a logic diagram, an electrical diagram, and a physical diagram, and a list of paths from input through memory cells to outputs. The mapping generator 524 can also generate input-memory-output paths based on the logic diagram, physical diagram, and the list of paths. The mapping generator 524 can also generate the input-memory-output mapping based on the input-memory-output paths. For example, the input-memory-output mapping may be a database table. The cell and redundancy mapper 526 can receive hardware testing results, an address, input/output (I/O) data, a redundancy status, and an input-memory-output mapping corresponding to a memory being tested. For example, the memory may be a static random-access memory (SRAM). The cell and redundancy mapper 526 can locate a failed cell of the memory based on the hardware testing results, the address, the input/output data, the redundancy status, and the input-memory-output mapping. The cell and redundancy mapper 526 can also output coordinates of the location of the failed cell of the memory. In some examples, the cell and redundancy mapper 526 can also may output a visualization of a physical location of a failed cell. In some examples, the cell and redundancy mapper 526 can also output a name of the location of the failed cell. For example, the name may be a cell full logic and physical hierarchy name. The memory repairer 528 can automatically repair the failed cell. For example, the memory repairer 528 can automatically repair the failed cell by replacing the wordline or the bitline of the faulty cell with other, redundant, wordline or bitline.

It is to be understood that the block diagram of FIG. 5 is not intended to indicate that the computing device 500 is to include all of the components shown in FIG. 5. Rather, the computing device 500 can include fewer or additional components not illustrated in FIG. 5 (e.g., additional memory components, embedded controllers, modules, additional network interfaces, etc.). Furthermore, any of the functionalities of the mapping generator 524, the cell and redundancy mapper 526, and the memory repairer 528 may be partially, or entirely, implemented in hardware and/or in the processor 502. For example, the functionality may be implemented with an application specific integrated circuit, logic implemented in an embedded controller, or in logic implemented in the processor 502, among others. In some embodiments, the functionalities of the mapping generator 524, cell and redundancy mapper 526, and memory repairer 528 can be implemented with logic, wherein the logic, as referred to herein, can include any suitable hardware (e.g., a processor, among others), software (e.g., an application, among others), firmware, or any suitable combination of hardware, software, and firmware.

The present techniques may be a system, a method or computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present techniques may be assembler instructions, instruction-set-architecture (ISA) instructions, machine instructions, machine dependent instructions, microcode, firmware instructions, state-setting data, or either code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present techniques.

Aspects of the present techniques are described herein with reference to flowchart illustrations and/or block diagrams of methods, apparatus (systems), and computer program products according to embodiments of the techniques. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Figure 6:
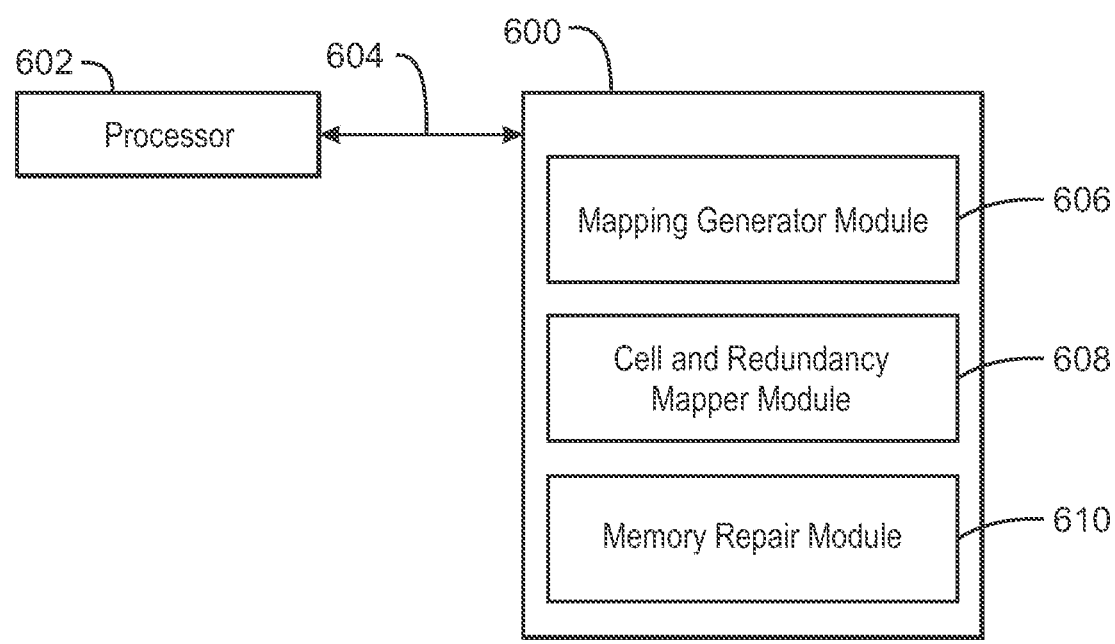
FIG. 6 is an example tangible, non-transitory computer-readable medium that can automatically locate and repair failures in memory using redundancy.

Referring now to FIG. 6, a block diagram is depicted of an example tangible, non-transitory computer-readable medium 600 that can automatically locate and repair failures in memory using redundancy. The tangible, non-transitory, computer-readable medium 600 may be accessed by a processor 602 over a computer interconnect 604. Furthermore, the tangible, non-transitory, computer-readable medium 600 may include code to direct the processor 602 to perform the operations of the methods 400 and 500 of FIGS. 4 and 5 above.

The various software components discussed herein may be stored on the tangible, non-transitory, computer-readable medium 600, as indicated in FIG. 6. For example, a mapping generator 606 includes code to receive a logic diagram, an electrical diagram, and a physical diagram, and a list of paths from input through memory cells to outputs. The mapping generator module 606 also includes code to generate input-memory-output paths based on the logic diagram, physical diagram, and the list of paths. The mapping generator module 606 includes code to generate an input-memory-output mapping based on the input-memory-output paths. A cell and redundancy mapper module 608 includes code to receive hardware testing results, an address, input/output (I/O) data, a redundancy status, and an input-memory-output mapping corresponding to a memory being tested. The cell and redundancy mapper module 608 further includes code to locate a failed cell of the memory based on the hardware testing results, the address, the input/output data, the redundancy status, and the input-memory-output mapping. The cell and redundancy mapper module 608 also includes code to. In some examples, the cell and redundancy mapper module 608 further includes code to output coordinates of the location of the failed cell of the memory. In some examples, the cell and redundancy mapper module 608 further includes code to output a visualization of a physical location of a failed cell. In some examples, the cell and redundancy mapper module 608 further includes code to output a name of the location of the failed cell. For example, the name may be a cell full logic and physical hierarchy name. In some examples, the cell and redundancy mapper module 608 further includes code to output a repair indicator. A memory repair module 610 includes code to automatically repair the failed cell. For example, the memory repair module 610 may include code to replace a wordline or a bitline of the failed cell with a redundant wordline or a redundant bitline. It is to be understood that any number of additional software components not shown in FIG. 6 may be included within the tangible, non-transitory, computer-readable medium 600, depending on the particular application.

The flowchart and block diagrams in the Figures illustrate the architecture, functionality, and operation of possible implementations of systems, methods, and computer program products according to various embodiments of the present techniques. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present techniques have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising a processor to:
   receive hardware testing results, an address, input/output data, a redundancy status, and an input-memory-output mapping corresponding to a memory being tested;
   locate a failed cell of the memory based on the hardware testing results, the address, the input/output data, the redundancy status, and the input-memory-output mapping;
   output a visualization of a physical location of the failed cell; and
   automatically repair the failed cell,
   wherein the redundancy status indicates a type of redundancy used by the memory being tested, the type of redundancy identified from a group comprising row redundancy, column redundancy, and both row and column redundancy.

2. The system of claim 1, wherein the processor is to
   receive a logic diagram, an electrical diagram, and a physical diagram, and a list of paths from input through memory cells to outputs;
   generate input-memory-output paths based on the logic diagram, the physical diagram, and the list of paths; and
   generate the input-memory-output mapping based on the input-memory-output paths.

3. The system of claim 1, wherein the processor is to output coordinates of the location of the failed cell of the memory.

4. The system of claim 1, wherein the processor is to output a name of the location of the failed cell of the memory, the name comprising a cell full logic and physical hierarchy name.

5. The system of claim 1, wherein the input-memory-output mapping comprises a database table.

6. The system of claim 5, wherein the memory comprises static random-access memory (SRAM).

7. A computer-implemented method, comprising:
   receiving hardware testing results, an address, input/output data, a redundancy status, and an input-memory-output mapping corresponding to a memory being tested;
   locating a failed cell of the memory based on the hardware testing results, the address, the input/output data, the redundancy status, and the input-memory-output mapping;
   outputting a visualization of a physical location of the failed cell; and
   automatically repairing the failed cell,
   wherein the redundancy status indicates a type of redundancy used by the memory being tested, the type of redundancy identified from a group comprising row redundancy, column redundancy, and both row and column redundancy.

8. The computer-implemented method of claim 7, further comprising:
  receiving a logic diagram, an electrical diagram, and a physical diagram, and a list of paths from input through memory cells to outputs;
  generating input-memory-output paths based on the logic diagram, the physical diagram, and the list of paths; and
  generating the input-memory-output mapping based on the input-memory-output paths.

9. The computer-implemented method of claim 7, comprising outputting a name of a location of the failed cell.

10. The computer-implemented method of claim 7, comprising outputting coordinates of the location of the failed cell of the memory.

11. The computer-implemented method of claim 7, comprising outputting a repair indicator.

12. The computer-implemented method of claim 7, wherein repairing the failed cell comprises replacing a wordline or a bitline of the failed cell with a redundant wordline or a redundant bitline.

13. A computer program product for locating failed cells in memory, the computer program product comprising a non-transitory computer-readable storage medium having program code embodied therewith, wherein the non-transitory computer readable storage medium having program code embodied therewith: receive hardware testing results, an address, input/output data, a redundancy status, and an input-memory-output mapping corresponding to a memory being tested;
  locate a failed cell of the memory based on the hardware testing results, the address, the input/output data, the redundancy status, and the input-memory-output mapping;
  output a visualization of a physical location of the failed cell; and
  automatically repair the failed cell,
  wherein the redundancy status indicates a type of redundancy used by the memory being tested, the type of redundancy identified from a group comprising row redundancy, column redundancy, and both row and column redundancy.

14. The computer program product of claim 13, further comprising program code executable by the processor to:
  receive a logic diagram, an electrical diagram, and the physical diagram, and a list of paths from input through memory cells to outputs;
  generate input-memory-output paths based on the logic diagram, physical diagram, and the list of paths; and
  generate the input-memory-output mapping based on the input-memory-output paths.

15. The computer program product of claim 13, further comprising program code executable by the processor to output coordinates of the location of the failed cell of the memory.

16. The computer program product of claim 13, further comprising program code executable by the processor to output a name of the location of the failed cell, the name comprising a cell full logic and physical hierarchy name.

17. The computer program product of claim 13, further comprising program code executable by the processor to output a repair indicator.

* * * * *